(12) United States Patent
Yamazaki et al.

(10) Patent No.: US 7,186,597 B2
(45) Date of Patent: Mar. 6, 2007

(54) METHOD OF MANUFACTURING TRANSISTORS

(75) Inventors: Shunpei Yamazaki, Tokyo (JP); Hisashi Ohtani, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/187,845

(22) Filed: Jul. 25, 2005

(65) Prior Publication Data

US 2005/0255626 A1    Nov. 17, 2005

Related U.S. Application Data

(63) Continuation of application No. 10/114,172, filed on Apr. 1, 2002, now Pat. No. 6,949,418, which is a continuation of application No. 09/025,586, filed on Feb. 17, 1998, now Pat. No. 6,420,246.

(30) Foreign Application Priority Data

Feb. 17, 1997   (JP) .................................. 9-048488

(51) Int. Cl.
*H01L 21/00* (2006.01)
*H01L 21/84* (2006.01)

(52) U.S. Cl. .................. 438/149; 438/58; 438/162; 438/166; 438/474; 257/E21.133; 257/E21.32

(58) Field of Classification Search ................ 438/58, 438/149, 162, 166, 474, 476; 257/E21.133, 257/E21.32
See application file for complete search history.

(56) References Cited

U.S. PATENT DOCUMENTS 5,244,819 A    9/1993   Yue 5,534,716 A    7/1996   Takemura (Continued)

FOREIGN PATENT DOCUMENTS

JP    06-244103    9/1994

(Continued)

OTHER PUBLICATIONS

Kohno et al., High Performance Poly-Si TFTs Fabricated Using Pulsed Laser Annealing and Remote Plasma CVD with Low Temp. Processing IEEE, pp. 251-257 (1995).

(Continued)

*Primary Examiner*—Fernando L. Toledo
(74) *Attorney, Agent, or Firm*—Fish & Richardson P.C.

(57) ABSTRACT

A mask is formed selectively on a crystalline silicon film containing a catalyst element, and an amorphous silicon film is formed so as to cover the mask. Phosphorus is implanted into the amorphous silicon film and the portion of the crystalline silicon film which is not covered with the mask. The silicon films are then heated by rapid thermal annealing (RTA). By virtue of the existence of the amorphous silicon film, the temperature of the crystalline silicon film is increased uniformly, whereby the portion of the crystalline silicon film covered with the mask is also heated sufficiently and the catalyst element existing in this region moves to the phosphorus-implanted, amorphous portion having high gettering ability. As a result, the concentration of the catalyst element is reduced in the portion of the silicon film covered with the mask. A semiconductor device is manufactured by using this portion.

21 Claims, 4 Drawing Sheets

U.S. PATENT DOCUMENTS

| | | | |
|---|---|---|---|
| 5,608,232 A | 3/1997 | Yamazaki et al. | |
| 5,616,506 A | 4/1997 | Takemura | |
| 5,639,698 A | 6/1997 | Yamazaki et al. | |
| 5,643,826 A | 7/1997 | Ohtani et al. | |
| 5,700,333 A | 12/1997 | Yamazaki et al. | |
| 5,736,438 A | 4/1998 | Nishimura et al. | |
| 5,773,309 A | 6/1998 | Weiner | |
| 5,773,329 A | 6/1998 | Kuo | |
| 5,789,284 A | 8/1998 | Yamazaki et al. | |
| 5,821,138 A | 10/1998 | Yamazaki et al. | |
| 5,834,071 A | 11/1998 | Lin | |
| 5,834,345 A | 11/1998 | Shimizu | |
| 5,851,860 A * | 12/1998 | Makita et al. | 438/166 |
| 5,869,363 A | 2/1999 | Yamazaki et al. | |
| 5,879,977 A | 3/1999 | Zhang et al. | |
| 5,897,347 A | 4/1999 | Yamazaki et al. | |
| 5,923,962 A | 7/1999 | Ohtani et al. | |
| 5,956,579 A | 9/1999 | Yamazaki et al. | |
| 6,071,766 A | 6/2000 | Yamazaki et al. | |
| 6,087,245 A | 7/2000 | Yamazaki et al. | |
| 6,251,712 B1 | 6/2001 | Tanaka et al. | |
| 6,420,246 B1 | 7/2002 | Yamazaki et al. | |
| 6,518,102 B1 | 2/2003 | Tanaka et al. | |
| 6,949,418 B2 * | 9/2005 | Yamazaki et al. | 438/149 |
| 2003/0134459 A1 | 7/2003 | Tanaka et al. | |

FOREIGN PATENT DOCUMENTS

| | | |
|---|---|---|
| JP | 06-244104 | 9/1994 |
| JP | 07-066425 | 3/1995 |
| JP | 07-130652 | 5/1995 |
| JP | 07-307286 | 11/1995 |
| JP | 07-335548 | 12/1995 |
| JP | 08-236471 | 9/1996 |
| JP | 08 273316 | 10/1996 |
| JP | 08 330602 | 12/1996 |
| KR | 10-265179 | 9/2000 |

OTHER PUBLICATIONS

Merriam-Webster's Collegiate Dictionary; pp. 46-47; 10th Edition; Copyright 1999; Merriam-Webster, Inc., Springfield, Massachusetts.

Wolf et al., Silicon Processing for the VLSI Era, vol. 1, Process Technology, pp. 307-308, 1986.

* cited by examiner

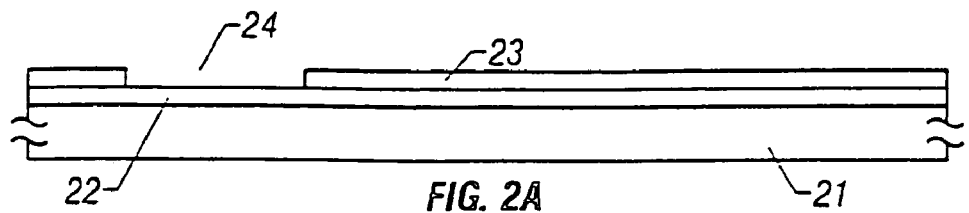
FIG. 2A
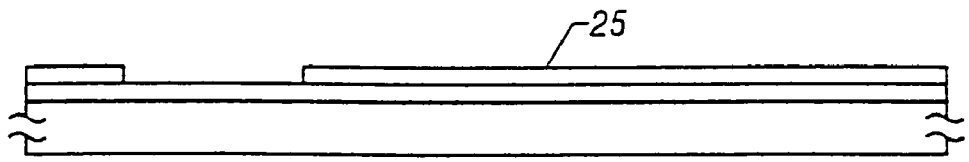
FIG. 2B
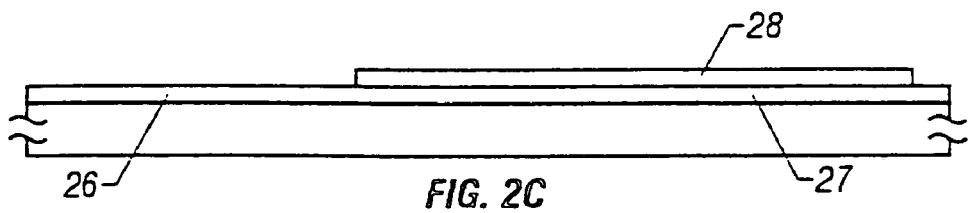
FIG. 2C
FIG. 2D
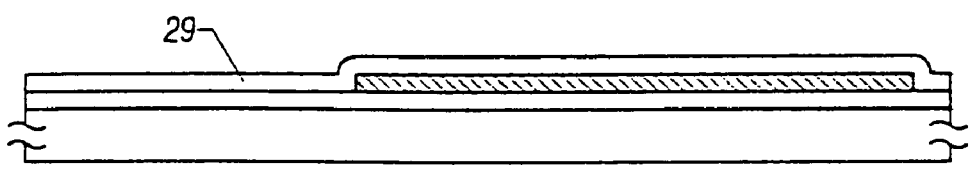
PHOSPHORUS ION
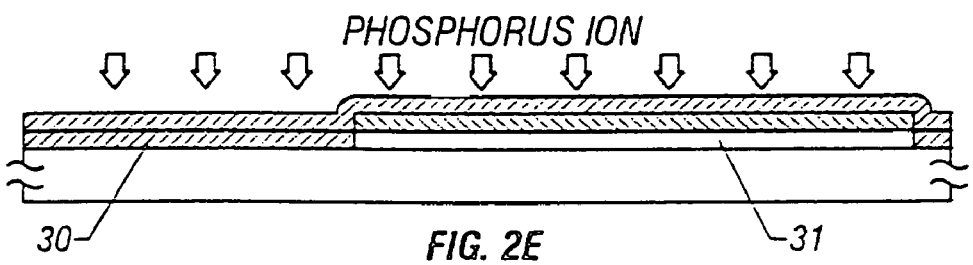
FIG. 2E
R T A
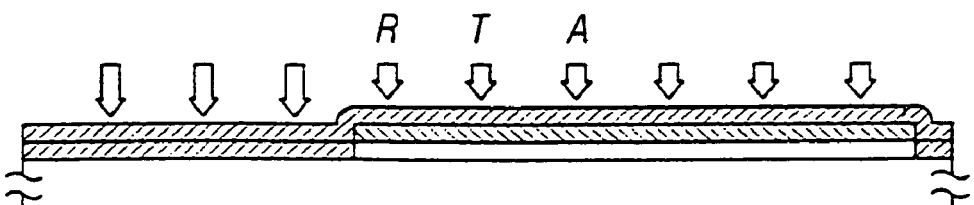
FIG. 2F
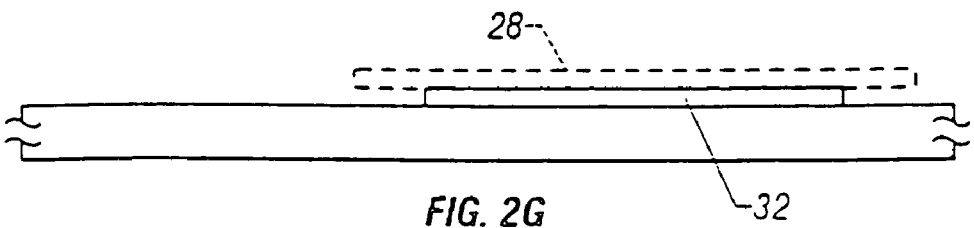
FIG. 2G

METHOD OF MANUFACTURING TRANSISTORS

CROSS-REFERENCE TO RELATED APPLICATIONS

This application is a continuation of U.S. application Ser. No. 10/114,172, filed Apr. 1, 2002, now U.S. Pat. No. 6,949,418, which is a continuation of U.S. application Ser. No. 09/025,586, filed Feb. 17, 1998, now U.S. Pat. No. 6,420,246, which claims the benefit of a foreign priority application filed in Japan as Ser. No. 09-048488 on Feb. 17, 1997. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a manufacturing method of a silicon film having crystallinity or a silicon compound film (for instance, a SiGe semiconductor film) having crystallinity. For example, the invention can be applied to manufacture of a thin-film transistor.

2. Description of the Related Art

The thin-film transistor (hereinafter abbreviated as "TFT") is known which uses a thin-film semiconductor. This is formed by using a thin-film semiconductor, particularly a silicon semiconductor film, that is formed on a substrate. While the TFT is used in various kinds of integrated circuits, it now attracts much attention particularly as a switching element provided for each pixel of an active matrix liquid crystal display device and a driver element formed in peripheral circuit sections of the same. The TFT now attracts much attention also as a device indispensable for multilayered integrated circuits (three-dimensional ICs).

As for a silicon film used in the TFT, it is simple and convenient to use an amorphous silicon film formed. However, the electrical characteristics of a resulting TFT are far lower than those of a TFT using a single crystal semiconductor for semiconductor integrated circuits. Therefore, at present, this type of TFT can be used for only limited purposes such as a switching element of an active matrix circuit. A silicon thin film having crystallinity may be used to improve the characteristics of the TFT.

Silicon films having crystallinity other than a single crystal silicon film are called a polysilicon film, a microcrystal silicon film, etc. Such a silicon film having crystallinity can be obtained by forming an amorphous silicon film and crystallizing it by heating (thermal annealing). This method is called a solid-phase growth method because conversion from an amorphous state to a crystal state is effected while the solid phase is maintained.

However, the silicon solid-phase growth has problems that the heating temperature and time need to be set at more than 600° C. and more than 10 hours, respectively, and that it is difficult to use an inexpensive glass substrate. For example, the Corning 7059 glass, which is commonly used in the active matrix liquid crystal display device, has a glass strain point of 593° C. Therefore, in view of increasing the substrate area, it is problematic to subject this glass to thermal annealing of more than 600° C. for a long time.

In connection with the above problems, studies of the present inventors have revealed that crystallization can be completed by performing heating at 550° C. for about 4 hours by depositing, by a very small amount, a certain kind of metal element such as nickel or palladium on the surface of an amorphous silicon film and then heating it. Naturally a silicon film even higher in crystallinity can be obtained by annealing of 600° C. and 4 hours. (refer to Japanese Unexamined Patent Publication No. Hei. 6-244103 (JP-A-6-244103).

To introduce a very small amount of metal element (for accelerating crystallization), various methods are available such as depositing a coating of a metal element or its compound by sputtering (refer to JP-A-6-244104), forming a coating of a metal element or its compound by such a means as spin coating (JP-A-7-130652), and forming a coating by decomposing a gas containing a metal element by thermal decomposition, plasma decomposition (JP-A-7-335548), or the like. Selection may be made properly among those methods in accordance with their features.

It is also possible to introduce a metal element selectively, i.e., into a particular portion, and then cause crystal growth to proceed from the portion where the metal element is introduced to the periphery by heating (called "lateral growth method"). Having directivity in crystallization, a crystalline silicon film produced by this method exhibits much superior characteristics when used properly in connection with the directivity.

It is also effective to further improve the crystallinity by performing illumination with strong light such as laser light after the crystallization step using a metal element (JP-A-7-307286). It is also effective to perform thermal oxidation after execution of the above-mentioned lateral growth method (JP-A-7-66425).

By performing crystallization by using a metal element in the above-described manner, a crystalline silicon film having better quality can be obtained at a lower temperature in a shorter time. The temperature of the heat treatment, which strongly depends on the kind of amorphous silicon film, is preferably set at 450°–650° C., even preferably at 550°–600° C.

However, the most serious problem of the above method is necessity of removing the introduced metal element. Adverse effects on the electrical characteristics and reliability of a metal element that is introduced in a silicon film are not negligible. In particular, because of the mechanism of the crystallization using a metal element, the metal element remains in the coating mainly as a conductive silicide and hence becomes a major cause of defects.

It is known that in general metal elements (particularly nickel, palladium, platinum, copper, silver, and gold) can be captured by crystal defects, phosphorus, etc. For example, JP-A-8-330602 discloses a technique for reducing the concentration of metal elements in a channel forming region by implanting phosphorus ions into a silicon film with a gate electrode as a mask and then performing thermal annealing (furnace annealing) or optical annealing (laser annealing or the like), thereby allowing metal elements that are contained in the silicon film to move to source and drain regions and fixing (gettering) the metal elements there.

In the technique of JP-A-8-330602, when phosphorus is implanted into the source and the drain, the silicon film is rendered amorphous and the number of crystal defects increases, whereby metal elements are gettered by phosphorus and crystal defects. The region where to implant phosphorus is not limited to the source and the drain, and may be any region except at least a region where a channel forming region is to be formed. It is apparent to a person having ordinary skill in the art that metal elements can be removed though the degree of removal depends on the distance from the phosphorus-implanted region.

To enable the gettering, annealing needs to be performed for a sufficient time for metal elements to move to the phosphorus-implanted region. Therefore, thermal annealing is suitable for this purpose. However, in general the annealing temperature effective for the gettering is more than 600° C. (it depends on the kind of metal element). Executing a process of such a high temperature for a long time increases a possibility that the substrate is deformed and hence becomes a factor of causing mask misalignment in later photolithography steps.

On balance, optical annealing is preferable. JP-A-8-330602 does not discuss a light source of the optical annealing and the embodiments include a statement that an excimer laser is used. However, the pulse width of excimer lasers is shorter than 100 nsec and experiments have shown that light illumination in such a short time cannot provide a sufficient gettering effect.

SUMMARY OF THE INVENTION

The present invention has been made in view of the above-described problems and an object of the invention is therefore to present conditions suitable for optical annealing and thereby provide a method effective in removing a catalyst element.

The basic concept of the invention is to heat a region from which a metal element is to be removed at a sufficiently high temperature for a sufficient time by optical annealing. The known rapid thermal annealing (RTA) method is preferable for the heating for a sufficient time.

Where the RTA method is used, high gettering efficiency can be obtained by heating of 1 second to 10 minutes though it depends on the temperature. Further, this method can heat only a particular material without the need for directly heating a substrate.

Still further, this heating process provides an effect of improvement in crystallinity in addition to the gettering action.

A crystalline silicon film obtained by utilizing a metal element for accelerating crystallization of silicon is in a polycrystalline state. The RTA decreases the number of dangling bonds at grain boundaries and inactivates grain boundaries, which is favorable for improving the device characteristics of devices manufactured.

However, there is the following problem. A phosphorus-implanted region is highly light-absorptive and hence is sufficiently heated by optical annealing (laser annealing), because it is amorphous and phosphorus exists there. In contrast, a region concerned from which a catalyst element is to be removed is highly transparent and hence is not heated sufficiently, because it is crystalline.

Therefore, the temperature of the phosphorus-implanted region becomes higher than that of the region from which the metal element is to be removed. As a result, the amount of the metal element moving from the former region to the latter region is not negligible as compared with the amount of the metal element moving from the latter region to the former region, resulting in reduction in gettering efficiency.

Naturally a large part of the metal element atoms existing in the phosphorus-implanted region are fixed because of the existence of a large amount of phosphorus and defects capable of capturing those, but a certain part are rendered movable in the above-mentioned state. In conclusion, a sufficient effect cannot be obtained unless the temperature of the region from which the metal element is to be removed is approximately equal to that of the phosphorus-implanted region.

According to the invention, in a step in which RTA is performed, the entire area of a silicon film is covered with an amorphous silicon film which is highly light-absorptive, whereby applied energy is effectively absorbed and hence the entire area of the silicon film is given a sufficiently high temperature. That is, a region where to effect gettering and a phosphorus-implanted region are heated uniformly. With this measure, nickel is allowed to move to the phosphorus-doped region with high efficiency; that is, nickel can be gettered with high efficiency.

In particular, it is even more preferable to have the amorphous silicon film contain a group-15 element such as phosphorus because the light-absorptiveness is increased. Further, as disclosed in JP-A-8-213316, the amorphous silicon film itself also exhibits a gettering effect because it has gettering ability due to defects included therein.

To implement the above concept, the invention provides a manufacturing process comprising the steps of: selectively forming a mask on a crystalline silicon film that has been obtained by utilizing a metal element for accelerating crystallization of silicon; accelerating and implanting a group-15 element into a region of the crystalline silicon film that is not covered with the mask; forming an amorphous silicon film so as to cover the mask and the crystalline silicon film; and heating the crystalline silicon film to a high temperature by illuminating it with strong light, to thereby allow the metal element to move from a region of the crystalline silicon film that is covered with the mask to another region of the crystalline silicon film (RTA step).

According to another aspect of the invention, there is provided a manufacturing process comprising the steps of: forming a mask on a crystalline silicon film that has been obtained by utilizing a metal element for accelerating crystallization of silicon; forming an amorphous silicon film so as to cover the mask and the crystalline silicon film; accelerating and implanting a group-15 element; and heating the crystalline silicon film to a high temperature by illuminating it with strong light, to thereby allow the metal element to move from a region of the crystalline silicon film that is covered with the mask to another region of the crystalline silicon film (RTA step).

One important point of the invention is the thickness of the amorphous silicon film. It is preferable that the thickness of the amorphous silicon film be more than 1,000 Å. If the amorphous silicon film is too thin, the light absorptiveness is insufficient. Where light is applied from above the substrate in the RTA step, the heat conduction becomes insufficient if the amorphous silicon film is too thick. In this case, it is preferable that the thickness of the amorphous silicon film be less than 5,000 Å.

Similarly, the heat conduction becomes insufficient if the mask that is provided between the amorphous silicon film and the crystalline silicon film is too thick. It is preferable that the thickness of the mask be less than 2,000 Å. A thin (10–100 Å) film such as a silicon oxide film may be provided between the mask and the crystalline silicon film to improve the adhesion between those.

It is preferable that the material of the mask be different from the material of the undercoat of the crystalline silicon film. This is because the undercoat is also etched in etching the mask if the mask and the undercoat are made of the same material since the phosphorus-implanted portion of the silicon film does not exist after completion of the gettering.

In the RTA step, light may be applied from below the substrate, i.e., from the back surface side.

In the present invention, the portion of the silicon film from which the metal element is to be removed is heated to 600°–1,200° C., preferably 700°–1,000° C. In the RTA method, since a portion that absorbs light is heated in a concentrated manner, the temperature of the substrate is kept much lower than the above temperature range and hence the influences of the RTA on the substrate are negligible.

The metal element may be one or a plurality of elements selected from Fe, Co, Ni, Ru, Rh, Pd, Os, Ir, Pt, Cu, and Au. In particular, the use of nickel (Ni) is most desirable in terms of reproducibility and effect.

In addition to phosphorus (P), other group-15 elements such as N, As, Sb, and Bi may be used. However, phosphorus can attain the highest effect. In particular, the use of phosphorus is most desirable when nickel is used as the metal element for accelerating the crystallization. This is because compounds of nickel and phosphorus exist in various states as exemplified by $Ni_3P$, $Ni_5P_2$, $Ni_2P$, $Ni_3P_2$, $Ni_2P_3$, $NiP_2$, and $NiP_3$ in very stable manners. That is, nickel and phosphorus tend to combine with each other easily and the combined states are very stable.

During the gettering, grain boundaries in a silicon film obstruct movement of the metal element. In general, in a silicon film immediately after solid-phase growth, the metal element precipitates in grain boundaries in the form of suicides to cause the grain boundaries to grow. Since such silicides are stable thermodynamically (the metal element precipitates in drain boundaries because precipitated states are more stable thermodynamically), the metal element is not prone to escape from the grain boundaries. Grain boundaries cause another problem that they capture and fix metal element atoms coming from other portions.

In contrast, where laser annealing is performed by illuminating pulse laser light to a silicon film that has been crystallized by solid-phase growth, the tendency that the metal element precipitates in grain boundaries is greatly reduced. This is because the duration of the pulsed laser annealing is too short to allow stabilization in terms of thermodynamics (particularly in a case where the pulse width is 1 μsec or less) and hence the growth of grain boundaries is insufficient. For this reason, in a silicon film after pulsed laser annealing, a large part of metal element atoms exists in a dispersed manner. Since such metal element atoms are highly mobile and grain boundaries large enough to capture those atoms is small in number, the gettering can be effected efficiently.

In the present invention, it is preferable that the concentration of the group-15 element be one order or more higher than that of the metal element, and be as high as $5 \times 10^{19}$ to $2 \times 10^{21}$ atoms/cm$^3$. At the same time as the group-15 element is implanted, hydrogen, oxygen, nitrogen, or carbon may be implanted at $1 \times 10^{19}$ to $1 \times 10^{21}$ atoms/cm$^3$. These elements, when introduced by a large amount, obstruct the crystallization by the RTA, and hence can maintain the number of defects in a portion in which the group-15 element has been implanted. Further, the transparency is increased in a silicon film having a high concentration of carbon, nitrogen, or oxygen. Therefore, the phosphorus-implanted portion is made less light-absorptive and hence the heating is suppressed there.

The group-15 element may be added in advance, i.e., at the time of forming an amorphous silicon film. Also in this case, it is preferable that the concentration of the group-15 element be set within the above-mentioned range.

The present invention is also characterized in that the gettering is performed before or during a step of defining the active layer of a transistor by etching a silicon film.

BRIEF DESCRIPTION OF THE DRAWINGS

FIGS. 2A–2G show a manufacturing process according to a second embodiment of the invention;

DETAILED DESCRIPTION OF THE PREFERRED EMBODIMENTS

Embodiment 1

This embodiment is directed to a case of forming a silicon film having crystallinity on a glass substrate. Steps of providing a metal element (in this embodiment, nickel) adjacent to an amorphous silicon film, crystallizing it, gettering the metal element, and defining an active layer will be described with reference to FIGS. 1A–1G.

First, an amorphous silicon film 12 is formed by plasma CVD or LPCVD on a silicon oxide film (not shown) having a thickness of 1,000–5,000 Å, for instance, 2,000 Å, that has been formed on a substrate 11 by sputtering or plasma CVD. In this embodiment, a 500 Å-thick amorphous silicon film 12 is formed by plasma CVD. A hydrofluoric acid treatment is then performed to remove stain and a native oxide film.

Instead of an amorphous silicon film, an amorphous semiconductor film of a silicon compound such as a compound semiconductor $Si_xGe_{1-x}$ may be used.

An ultra-thin film of nickel is then formed (by spin coating in this embodiment). Detailed conditions are shown in the first embodiment of JP-A-7-130652. That is, a silicon oxide film (not shown) of 10–50 Å in thickness is formed by performing illumination with ultraviolet light (emitted from a low-pressure mercury lamp) for 5 minutes in an oxygen atmosphere. Then, a nickel acetate solution of 2 ml containing nickel at 100 ppm is dropped on the substrate and a resulting state is maintained for a certain period. Further, spin drying is performed with a spinner (2,000 rpm, 60 seconds).

Figure 1A:
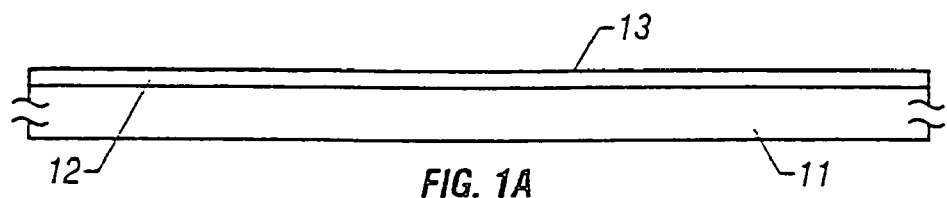
FIGS. 1A–1G show a manufacturing process according to a first embodiment of the present invention.
Figure 1B:
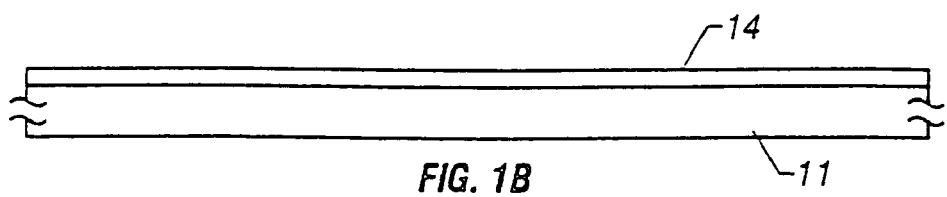
Figure 1C:
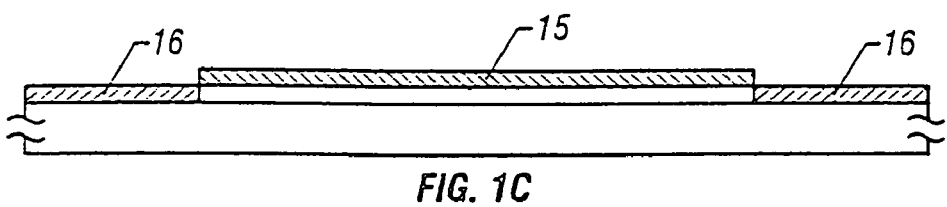
Figure 1D:
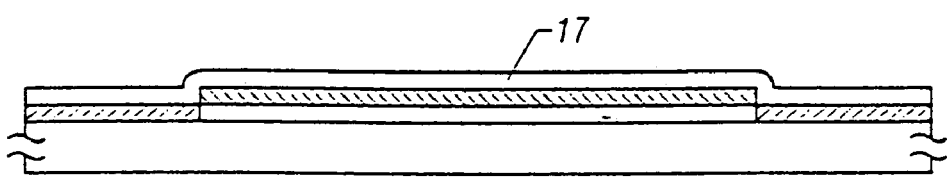
Figure 1E:
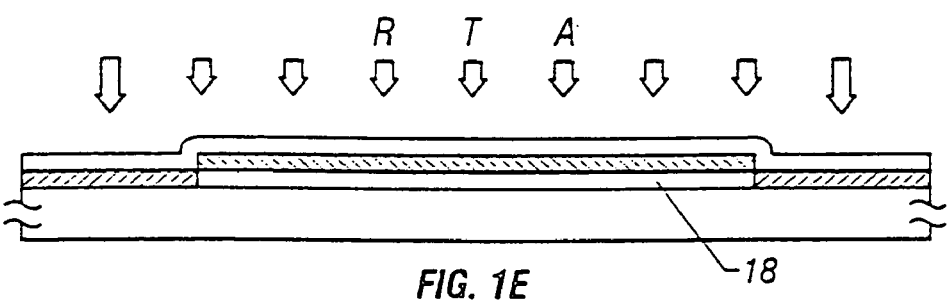

An ultra-thin film 13 of nickel acetate is thus formed (see FIG. 1A). The nickel acetate thin film 13 is extremely thin and may not be a continuous film. However, there is no problem even if it is not continuous.

A solid-phase growth (crystallization) step is thereafter executed. That is, settings are so made that the substrate is heated at 550°–600° C., for instance, 600° C., in a nitrogen atmosphere and this state is maintained for a predetermined period. Nickel acetate is thermally decomposed at about 300° C. to produce nickel, which exhibits a catalyst function at 450° C. or more. Crystallization of the amorphous silicon film 12 thus proceeds. A crystallized silicon film 14 is obtained by maintaining the above state for a necessary period, for instance, 4 hours (see FIG. 1B).

Then, after the surface silicon oxide film that has been formed previously is removed by a hydrofluoric acid treatment, a silicon nitride film (thickness: 1,000 Å) is formed on the silicon film 14 by plasma CVD. A silicon nitride film may have very strong stress and be prone to peel off, depending its composition. This problem can be solved by selecting a proper composition (particularly the hydrogen content) or forming a silicon oxide film of 10–100 Å in thickness between the crystalline silicon film 14 and the silicon nitride film.

Thereafter, a mask 15 is formed by etching the silicon nitride film and phosphorus ions are implanted into regions that are not covered with the mask 15 by ion doping (plasma doping). This is done by accelerating an ionized doping gas (in this embodiment, phosphine ($PH_3$) diluted with hydrogen) of low pressure (about $10^{-5}$ Torr) by application of a high voltage.

The acceleration voltage and the dose are respectively set at 5–25 kV and $1 \times 10^{13}$ to $8 \times 10^{15}$ atoms cm$^2$, for instance, $1 \times 10^{15}$ atoms/cm$^2$. If it is assumed that phosphorus is uniformly distributed in the silicon film 14, its concentration amounts to about $7 \times 10^{19}$ atoms/cm$^3$. Phosphorus-implanted regions 16 are thus obtained (see FIG. 1C).

A 2,000-Å-thick amorphous silicon film 17 is then formed by plasma CVD. Although in this embodiment, there is employed an amorphous silicon film that is intentionally not doped with any impurity, a proper amount of phosphorus may be added by mixing phosphine or the like in the material gas (see FIG. 1D).

Thereafter, the crystalline silicon film 14, the amorphous silicon film 17, and the mask 15 are heated by RTA. In this embodiment, the maximum temperature and the heating time with the maximum temperature are set at 800° C. and 1 minute, respectively. Light is applied from above the substrate. In this step, metal element atoms existing in a silicon film region 18 (this region is intrinsic) under the mask 15 move horizontally and are gettered in the phosphorus-implanted region 16 (see FIG. 1E).

Figure 1F:
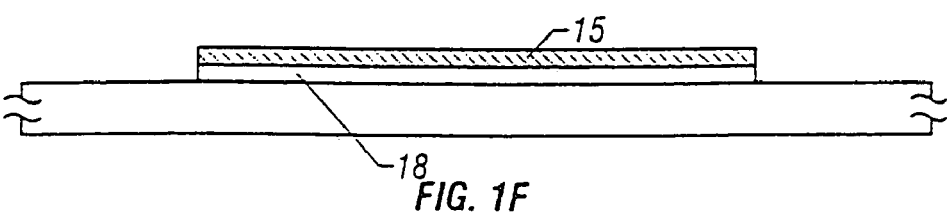
Figure 1G:
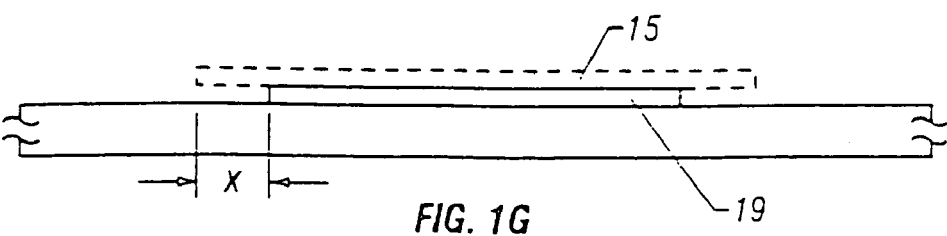

Then, the amorphous silicon film 17 and the phosphorus-implanted regions 16 of the crystalline silicon film 14 are removed by etching with such etching conditions that the silicon nitride mask 15 serves as an etching stopper. As a result, the region 18 of the crystalline silicon film 14 located under the mask 15 remains (FIG. 1F).

Finally, the mask 15 is removed and an active layer 19 of a transistor is formed by etching a part of the crystalline silicon film 18. In removing the mask 15, the underlying member (silicon oxide film) is little damaged if the etching is performed under such conditions as to etch only the mask 15 (the mask 15 (silicon nitride) and the underlying member (silicon oxide) are made of different materials).

An active layer 19 is defined by etching those portions of the region 18 which have a length x as measured from the end of each phosphorus-implanted region 16. This is to prevent phosphorus atoms that were diffused in the RTA step etc. from influencing the active layer (see FIG. 1G).

The active layer 19 that is crystallized and reduced in nickel concentration is thus obtained by the above steps.

Embodiment 2

This embodiment is directed to a case where in the manufacturing method of the first embodiment, a mask of a silicon nitride film is formed before forming a coating of a metal element, nickel is introduced selectively by using the thus-formed mask, performing lateral crystallization by solid-phase growth, and removing nickel by implanting phosphorus. FIGS. 2A–2G outline a manufacturing process according to this embodiment.

First, an amorphous silicon film 22 of 500 Å–1,000 Å in thickness is formed by plasma CVD or low-pressure CVD on a silicon oxide film (not shown) of 1,000–5,000 Å in thickness that is formed on a glass substrate 21.

A silicon nitride film 23 to serve as a mask film is formed by plasma CVD at a thickness of more than 1,000 Å (in this embodiment, 1,200 Å). The present inventors have confirmed through experiments that no problems occur even if the silicon nitride film 23 is as thin as 500 Å. However, to prevent an event that nickel is introduced into an unintended position due to a pinhole or the like, in this embodiment, the thickness of the silicon nitride film 23 is set with an additional margin. For stress reduction, a silicon oxide film may be provided under the silicon nitride film 23.

A window 24 for nickel introduction is then formed by etching the silicon nitride film 23 into a necessary pattern by an ordinary photolithography/patterning process (see FIG. 2A).

A nickel acetate ultra-thin film 25 having a desired thickness is deposited on the thus-processed substrate by spin coating in the same manner as in the first embodiment (see FIG. 2B).

Subsequently, the amorphous silicon film 22 is crystallized by performing a heat treatment at 550° C. for 8 hours in a nitrogen atmosphere. The crystallization starts from a portion 26 where the nickel acetate film 25 is in close contact with the amorphous silicon film 22. The crystallization thereafter proceeds toward the periphery, whereby a region 27 covered with the mask film 23 is also crystallized.

When lateral crystallization is performed as in this embodiment, three regions having different properties are generally obtained. The first region is a region 26 (see FIG. 2C) where the nickel acetate film has been in close contact with the amorphous silicon film 22. The region 26 is crystallized at the first stage of the thermal annealing step and is called a vertical growth region. The nickel concentration is relatively high in the region 26. Further, since crystallizing directions are not equalized, the crystallinity of a resulting silicon is not much superior. Therefore, in the region 26, the etching rate with respect to hydrofluoric acid and other acids is relatively high.

The second region is a region 27 (see FIG. 2C) where the lateral crystallization has been effected, and is called a lateral growth region. Having well-equalized crystallizing directions and a relatively low nickel concentration, the region 27 is suitable for device formation. The third region is an amorphous region where the lateral crystallization has not reached.

Thereafter, a mask 28 is formed by further etching the silicon nitride-film 23. Where wet etching is used in this step, that region 26 of the silicon film corresponding to the opening 24 may be severely etched depending on the etchant.

This is due to a high nickel concentration in the region 26. Although this phenomenon is favorable for the purpose of positively removing nickel from the silicon film, it may be problematic in terms of influences on the undercoat film and the substrate 21. If those influences are not serious, the step of positively removing, by etching, nickel (existing mainly as nickel silicide in this case) may be employed.

A 2,000-Å-thick amorphous silicon film 29 is then formed by plasma CVD (see FIG. 2D). In this embodiment, no element for intentionally imparting conductivity is added to the amorphous silicon film 29.

Phosphorus ions are then implanted by ion doping. Phosphine ($PH_3$) that is diluted to 5% with hydrogen is used as a doping gas. The acceleration voltage and the dose are set at 10 kV and $8 \times 10^{14}$ atoms/cm$^2$, respectively. If it is assumed that phosphorus is distributed uniformly in the silicon film, its concentration amounts to about $1 \times 10^{20}$ atoms/cm$^3$. In this manner, the amorphous silicon film 29 and that part of the crystalline silicon film which is not covered with the mask 28 become a phosphorus-implanted region 30. Phosphorus is not implanted in a crystalline silicon film 31 under the mask 28 (see FIG. 2E)

Figure 3A:
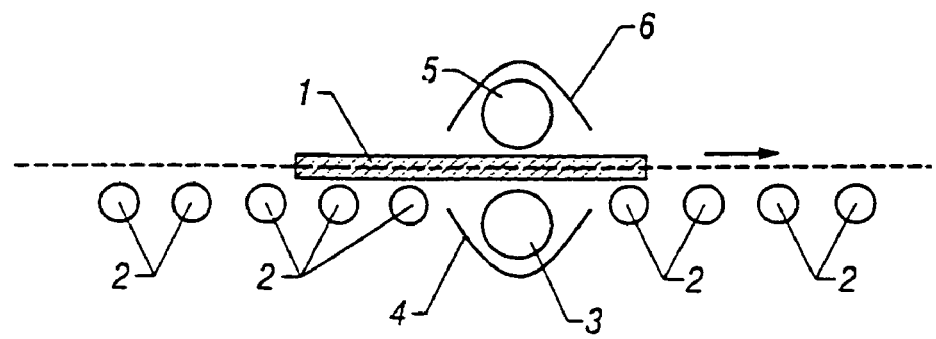
FIGS. 3A and 3B show a general structure and a characteristic of an RTA apparatus used in the second embodiment.

Thereafter, the crystalline silicon film 27, the amorphous silicon film 29, and the mask 28 are heated by RTA. FIG. 3A is a sectional view showing an RTA apparatus used. In this apparatus, linear main lamps 3 and 5 are provided above and below a substrate 1 and the substrate 1 is illuminated from below and above via concave mirrors 4 and 6. The substrate 1 moves in a direction indicated by an arrow in FIG. 3A so as to be located between the main lamps 3 and 5. The RTA apparatus is further provided with a plurality of linear lamps 2 for pre-heating.

Figure 3B:
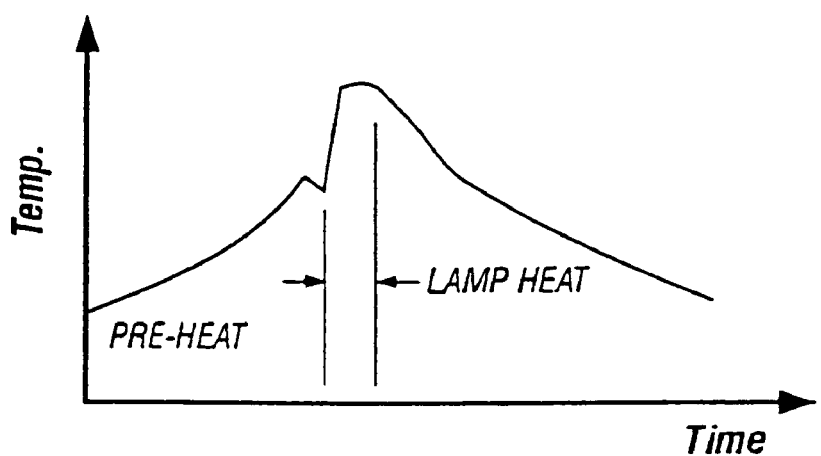

As the substrate 1 moves from left to right, it is heated by the pre-heating lamps 2 and its temperature slowly increases. The substrate 1 is then heated by the main lamps 3 and 5 and its temperature increases quickly (lamp heating). Thereafter, the temperature of the substrate 1 slowly decreases. The power applied to each pre-heating lamp 2 may be adjusted so that the temperature is higher at a position closer to the main lamps 3 and 5 (see FIG. 3B).

In this embodiment, the maximum temperature and the heating time with the maximum temperature are set at 700° C. and 10 minutes, respectively. Light is applied from the two directions, i.e., from above and below the substrate 21. In this step, nickel existing in the silicon film region 31 under the mask 28 is gettered in the phosphorus-implanted region 30 (see FIG. 2F).

Thereafter, the phosphorus-implanted region 30 including the amorphous silicon film 29 and the mask 28 are removed, and a part of the crystalline silicon film 31 is etched to form an active layer 32 of a transistor (see FIG. 2G).

The active layer 32 that is crystallized and reduced in nickel concentration is obtained by the above steps.

Embodiment 3

Figure 4A:
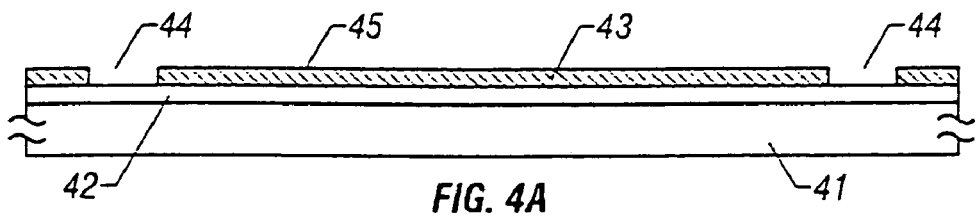
FIGS. 4A–4C show a manufacturing process according to a third embodiment of the invention.
Figure 4B:
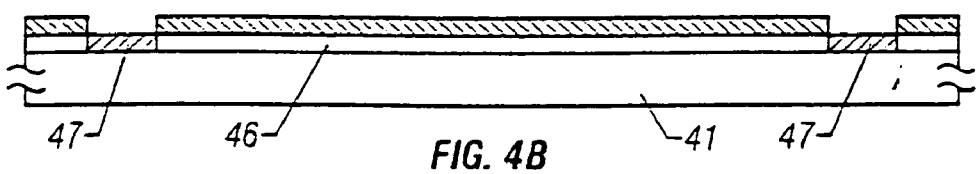
Figure 4C:
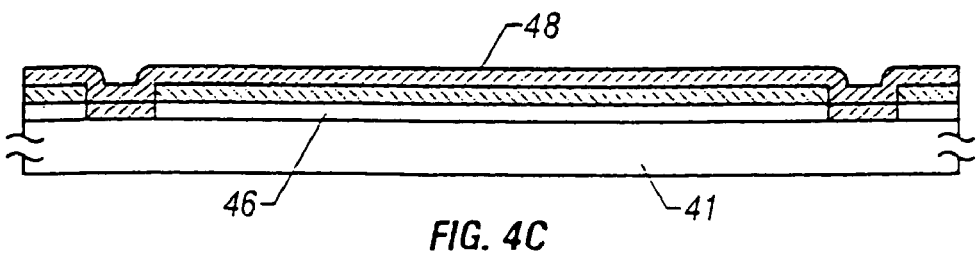

This embodiment is intended to simplify the process by using the same mask for the selective introduction of a metal element in causing the lateral growth as described in the second embodiment and for the implantation of phosphorus for gettering of the metal element. FIGS. 4A–4C outline a manufacturing process according to this embodiment.

First, an amorphous silicon film 42 of 500 Å–1,000 Å in thickness is formed by plasma CVD or low-pressure CVD on a silicon oxide film of 1,000–5,000 Å that is formed on a glass substrate (Corning 7059, 10-cm square) 41.

Then, a silicon nitride film 43 to become a mask film is formed by plasma CVD at a thickness of more than 1,000 Å (in this embodiment, 1,200 Å). Windows 44 for nickel introduction are then formed by etching the silicon nitride film 43 into a necessary pattern by a known photolithography/patterning process (see FIG. 4A). The windows 44 will also be used for phosphorus implantation in a later step.

After a nickel acetate ultra-thin film 45 having a desired thickness is deposited on the above-processed substrate by spin coating in the same manner as in the first embodiment, the amorphous silicon film 42 is crystallized into a crystalline silicon film 46 by performing a heat treatment at 550° C. for 8 hours in a nitrogen atmosphere.

Then, phosphorus ions are implanted by ion doping through the windows 44 under the same doping conditions as in the second embodiment. A phosphorus-implanted regions 47 are thus obtained which approximately coincide with vertical growth regions (see FIG. 4B).

A 2,000-Å-thick amorphous silicon film 48 doped with phosphorus is then deposited by plasma CVD (see FIG. 4C).

Thereafter, nickel is gettered by performing RTA as in the case of the first and second embodiments, whereby a silicon film that is crystallized and reduced in nickel concentration is obtained.

Embodiment 4

FIGS. 5A–5G outline a process of manufacturing a TFT by using a crystalline silicon film formed according to the present invention. This embodiment is directed to a case of etching a crystalline silicon film by using a mask that defines a region from which a metal element is to be removed, then forming a phosphorus-doped amorphous silicon film so as to be in close contact with the side faces of the crystalline silicon film, and finally performing gettering by using the thus-formed amorphous silicon film.

Figure 5A:
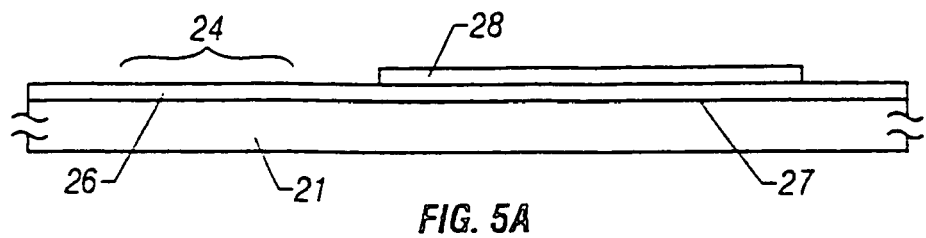
FIGS. 5A–5G show a TFT manufacturing process according to a fourth embodiment of the invention.
Figure 5B:
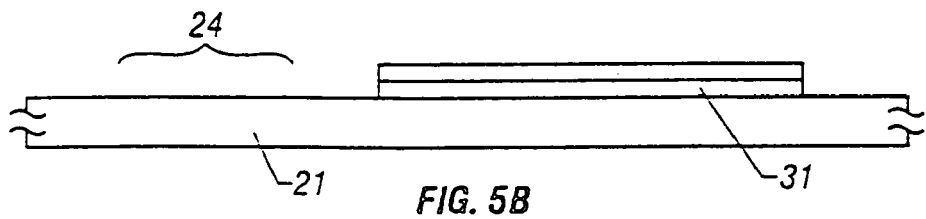
Figure 5C:
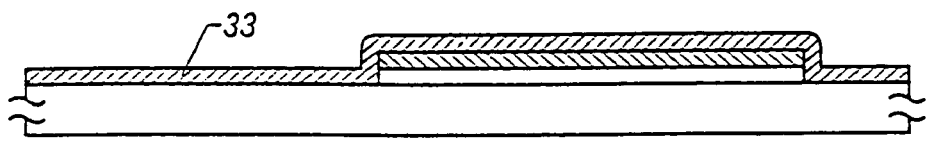
Figure 5D:
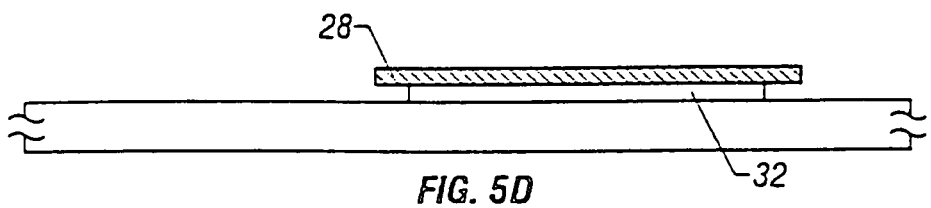
Figure 5E:
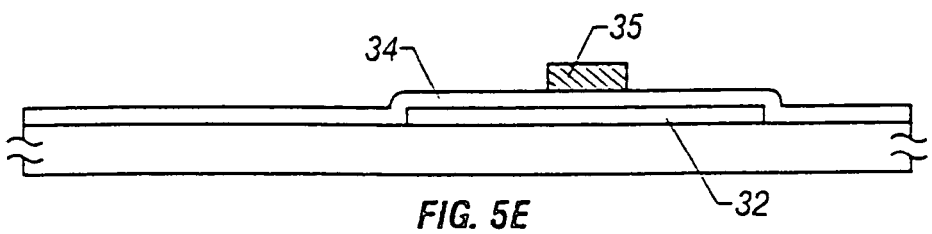
Figure 5F:
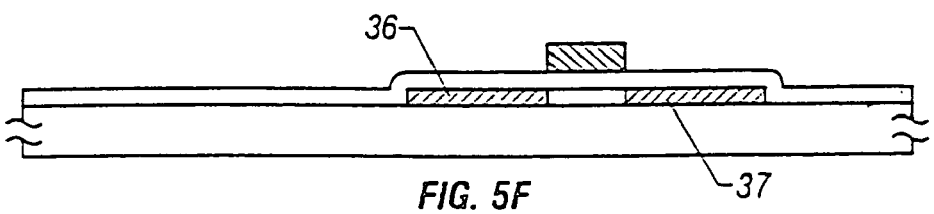
Figure 5G:
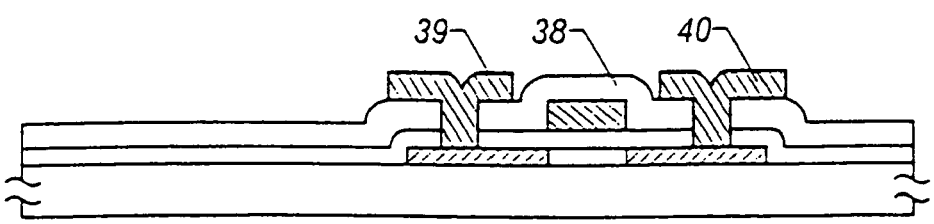

The steps of the second embodiment are executed to obtain the state of FIG. 2C. FIG. 5A shows the same state by using the same reference numerals as FIG. 2C. That is, reference numerals 28 and 27 denote a mask and a laterally-grown crystalline silicon film under the mask 28, respectively. A region 24 into which nickel is introduced exclusively exists in a vertically-grown crystalline silicon film 26 (see FIG. 5A).

The silicon film is then etched by anisotropic dry etching, whereby etching end faces are formed vertically so as to be flush with those of the mask 28. A crystalline silicon film 31 under the mask 28 is thus defined (see FIG. 5B).

Thereafter, an amorphous silicon film 33 of 2,000–5,000 Å (in this embodiment, 3,000 Å) in thickness is deposited by plasma CVD. Phosphorus is implanted into the amorphous silicon film 33 by ion doping. It is preferable that the ion doping be performed so as to provide a phosphorus concentration $1 \times 10^{20}$ to $5 \times 10^{21}$ atoms/cm$^3$ (see FIG. 5C).

Then, as in the case of the other embodiments, the amorphous silicon film 33 is etched by isotropic etching. As a result, side portions of the silicon film 31 are also etched and an active layer 32 is thereby defined (see FIG. 5D).

The mask 28 is then removed by etching to leave the active layer 32.

Then, a silicon oxide film 34, which will serve as a gate insulating film, is deposited at a thickness of 1,000–1,500 Å (for instance, 1,200 Å) by plasma CVD. Thereafter, a polysilicon film having a thickness of 2,000 Å to 1 µm and doped with phosphorus is formed by low-pressure CVD and then patterned into a gate electrode 35 (see FIG. 5E). Alternatively, the gate electrode 35 may be made of other materials such as various silicides and aluminum.

Then, an impurity (phosphorus) is implanted into the island-like silicon film 32 of a TFT by ion doping in a self-aligned manner by using the gate electrode 35 as a mask. Phosphine (PH$_3$) is used as a doping gas. Since the doping needs to be performed through the gate insulating film, the acceleration voltage is set at 50–80 kV. The dose is set at $1 \times 10^{13}$ to $4 \times 10^{14}$ atoms/cm$^2$, for instance, $5 \times 10^{13}$ atoms/cm$^2$. A source 36 and a drain 37 are thus formed. The phosphorus concentration in the source 36 and the drain 37 is estimated to be $1 \times 10^{19}$ atoms/cm$^3$ (see FIG. 5F)

Thereafter, a silicon oxide film of 3,000–8,000 Å in thickness as an interlayer insulating film 38 is formed over the entire surface by plasma CVD by using TEOS as a material and oxygen or by low-pressure CVD or atmospheric-pressure CVD by using TEOS as a material and ozone. The substrate temperature is set at 250°–450° C., for instance, 350° C. To improve the flatness of the surface of the thus-formed silicon oxide film, it may be polished mechanically or planarized by etch back.

Then, after contact holes for the source 36 and the drain 37 of a TFT are formed by etching the interlayer insulating film 38, aluminum interconnections/electrodes 39 and 40 are formed.

Finally, hydrogenation of silicon is completed by performing annealing at 300°–400° C. for 1–2 hours in a hydrogen atmosphere. A TFT is thus completed (see FIG. 5G).

Although the above description is directed to the manufacture of a top-gate TFT, the invention can also be utilized for manufacture of a bottom-gate TFT.

As described above, a metal element can be removed efficiently from a silicon film that has been obtained by crystallizing an amorphous silicon film by using the metal element for accelerating its crystallization. Therefore, the present invention can provide, in large quantities, highly reliable electronic devices that use a crystalline silicon film. The present invention is thus useful from the industrial viewpoint.

What is claimed is:

1. A method of manufacturing a transistor comprising:
   providing a semiconductor film comprising silicon with a metal element for accelerating crystallization of silicon;
   crystallizing said semiconductor film provided with said metal element;
   irradiating a laser light to said semiconductor film after said crystallizing of said semiconductor film; and
   removing said metal element from said semiconductor film by a rapid thermal annealing using a lamp after the irradiation of said laser light.

2. A method according to claim 1 wherein said metal element is selected from the group consisting of Fe, Co, Ni, Ru, Rh, Pd, Os, Ir, Pt, Cu and Au.

3. A method according to claim 1 wherein said semiconductor film has a temperature of 600 to 1200° C. by said rapid thermal annealing.

4. A method according to claim 1 wherein said semiconductor film comprises silicon.

5. A method according to claim 1 wherein said semiconductor film comprises $Si_x Ge_{1-x}$.

6. A method according to claim 1 wherein said crystallizing of said semiconductor film is carried out by a heat treatment.

7. A method according to claim 1 wherein said rapid thermal annealing improves crystallinity of said semiconductor film.

8. A method of manufacturing a transistor comprising:
   providing a semiconductor film comprising silicon with a metal element for accelerating crystallization of silicon;
   crystallizing said semiconductor film provided with said metal element;
   irradiating a pulse laser light to said semiconductor film after said crystallizing of said semiconductor film; and
   removing said metal element from said semiconductor film by a rapid thermal annealing using a lamp after the irradiation of said laser light.

9. A method according to claim 8 wherein said metal element is selected from the group consisting of Fe, Co, Ni, Ru, Rh, Pd, Os, Ir, Pt, Cu and Au.

10. A method according to claim 8 wherein said semiconductor film has a temperature of 600 to 1200° C. by said rapid thermal annealing.

11. A method according to claim 8 wherein said semiconductor film comprises silicon.

12. A method according to claim 8 wherein said semiconductor film comprises $Si_x Ge_{1-x}$.

13. A method according to claim 8 wherein said crystallizing of said semiconductor film is carried out by a heat treatment.

14. A method according to claim 8 wherein said rapid thermal annealing improves crystallinity of said semiconductor film.

15. A method of manufacturing a transistor comprising:
   providing a semiconductor film comprising silicon with a metal element for accelerating crystallization of silicon;
   crystallizing said semiconductor film provided with said metal element;
   irradiating a pulse laser light to said semiconductor film after said crystallizing of said semiconductor film; and
   removing said metal element from said semiconductor film by a rapid thermal annealing using a lamp after the irradiation of said laser light,
   wherein said pulse laser light has a pulse width of 1 μsec or less.

16. A method according to claim 15 wherein said metal element is selected from the group consisting of Fe, Co, Ni, Ru, Rh, Pd, Os, Ir, Pt, Cu and Au.

17. A method according to claim 15 wherein said semiconductor film has a temperature of 600 to 1200° C. by said rapid thermal annealing.

18. A method according to claim 15 wherein said semiconductor film comprises silicon.

19. A method according to claim 15 wherein said semiconductor film comprises $Si_xGe_{1-x}$.

20. A method according to claim 15 wherein said crystallizing of said semiconductor film is carried out by a heat treatment.

21. A method according to claim 15 wherein said rapid thermal annealing improves crystallinity of said semiconductor film.

* * * * *